US011887862B2

(12) United States Patent
Bishop et al.

(10) Patent No.: US 11,887,862 B2
(45) Date of Patent: Jan. 30, 2024

(54) METHOD FOR REDISTRIBUTION LAYER (RDL) REPAIR BY MITIGATING AT LEAST ONE DEFECT WITH A CUSTOM RDL

(71) Applicant: Deca Technologies USA, Inc., Tempe, AZ (US)

(72) Inventors: Craig Bishop, Scottsdale, AZ (US); David Ryan Bartling, Mesa, AZ (US); Timothy L. Olson, Phoenix, AZ (US)

(73) Assignee: Deca Technologies USA, Inc., Tempe, AZ (US)

( * ) Notice: Subject to any disclaimer, the term of this patent is extended or adjusted under 35 U.S.C. 154(b) by 0 days.

(21) Appl. No.: 17/939,833

(22) Filed: Sep. 7, 2022

(65) Prior Publication Data

US 2023/0085067 A1    Mar. 16, 2023

Related U.S. Application Data

(60) Provisional application No. 63/244,161, filed on Sep. 14, 2021.

(51) Int. Cl.
*H01L 21/48* (2006.01)
*H01L 23/498* (2006.01)

(52) U.S. Cl.
CPC ...... *H01L 21/485* (2013.01); *H01L 23/49838* (2013.01)

(58) Field of Classification Search
CPC .................. H01L 21/485; H01L 23/49838
See application file for complete search history.

(56) References Cited

U.S. PATENT DOCUMENTS

| 5,741,727 | A  | * | 4/1998  | Wang ............... H01L 21/76892 |
|           |    |   |         | 257/E21.595 |
| 7,296,103 | B1 |   | 11/2007 | Purdy |
| 2004/0227897 | A1 | * | 11/2004 | Wu .......................... H01J 9/50 |
|           |    |   |         | 349/192 |
| 2010/0039016 | A1 |   | 2/2010  | Lhee |
| 2010/0100356 | A1 | * | 4/2010  | Tsutsui ..................... H01J 9/50 |
|           |    |   |         | 445/61 |
| 2016/0163680 | A1 |   | 6/2016  | Lin |
| 2018/0019166 | A1 |   | 1/2018  | Cheng |
| 2021/0159165 | A1 |   | 5/2021  | Ahn |

* cited by examiner

*Primary Examiner* — Michael Jung
(74) *Attorney, Agent, or Firm* — Booth Udall Fuller, PLC; Bryce W. Burnham (57) ABSTRACT

The disclosure concerns methods of forming a semiconductor device with a repairable redistribution layer (RDL) design, comprising: preparing an original repairable RDL design; forming first conductive segments of the repairable RDL design; inspecting the first conductive segments of the repairable RDL design to detect manufacturing defects; detecting at least one defect in the first conductive segments; and forming second conductive segments of the repairable RDL design according to a new custom RDL design to mitigate the negative effects of the at least one defect among the first conductive segments. The disclosure also concerns semiconductor devices with a repairable RDL design.

20 Claims, 9 Drawing Sheets

METHOD FOR REDISTRIBUTION LAYER (RDL) REPAIR BY MITIGATING AT LEAST ONE DEFECT WITH A CUSTOM RDL

CROSS-REFERENCE TO RELATED APPLICATIONS

This disclosure claims the benefit, including the filing date, of U.S. Provisional Patent No. 63/244,161, entitled "System and Method for Redistribution Layer (RDL) Repair" which was filed on Sep. 14, 2021, the entire disclosure of which is hereby incorporated herein by this reference.

TECHNICAL FIELD

The disclosure concerns methods of forming a semiconductor device with a repairable redistribution layer (RDL) design.

BACKGROUND

Semiconductor devices are commonly found in modern electronic products. Semiconductor devices vary in the number and density of electrical components. Substrates and interposers provide structural support and electrical interconnectivity for semiconductor devices, packages, chips, passive devices, and other devices, module, and units. Substrates include circuit boards and printed circuit boards (PCBs). PCBs may be configured or arranged in numerous ways, as is known in the art, whether single layer, double layer, multi-layer, high density interconnect (HDI), high frequency, formed with a core or without a core (coreless), with or without a mesh or glass weave reinforcement, rigid, flexible, rigid-flex, laminates, interposers, or any other substrate or support material).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment, as well as in other fields and applications.

Semiconductor devices are generally manufactured using both front-end manufacturing, and back-end manufacturing. Front-end manufacturing involves the formation of a plurality of semiconductor die on the surface of a semiconductor wafer. Each semiconductor die can be identical and can contain circuits formed by electrically connecting active and passive components. Back-end manufacturing involves singulating individual semiconductor die from a finished wafer or wafers and packaging the die to provide structural support, environmental protection, and electrical interconnect from the die to the next level such as a printed circuit board, electrical interconnect between multiple die or die and other components such as passive devices, such as through including redistribution layers (RDLs).

SUMMARY

An opportunity exists for improved RDLs and repairable RDLs, including for packages, substrates, and semiconductor devices. Accordingly, in an aspect of the disclosure, a method of forming a repairable redistribution layer (RDL) design may comprise: preparing an original repairable RDL design; forming first conductive segments of the repairable RDL design; inspecting the first conductive segments of the repairable RDL design to detect manufacturing defects; detecting at least one defect in the first conductive segments; and forming second conductive segments of the repairable RDL design according to a new custom RDL design to mitigate the negative effects of the at least one defect among the first conductive segments.

In some embodiments, the at least one defect comprises a short between a portion of the first conductive segments. In certain embodiments, the short is repaired by forming at least one of the second conductive segments coupled to a redundant element previously formed as part of the original repairable RDL design to form a new route around the short.

In some embodiments, the defect is repaired using a redundant prebuilt trace to re-route around the defect and the defective trace being left unconnected.

In certain embodiments, the at least one defect comprises an open between a portion of the first conductive segments.

In some embodiments, the first conductive segments are formed at a first level and the second conductive segments are formed at a second level vertically offset from the first level.

In some embodiments, the first conductive segments and the second conductive segments are formed at a same level without vertical offset from the first level, the first conductive segments being laterally offset from the second conductive segments.

In some embodiments, the new custom RDL design is designed in real time during semiconductor device production and the new custom RDL design meets electrical constraints for the RDL while being designed in real time.

In certain embodiments, the first conductive segments comprise a length in a range of 80-90% of a total repairable RDL design length, with second conductive segments of the repairable RDL design including a length accounting for 10-20% of the total repairable RDL design length.

Another aspect of the disclosure is a repairable redistribution layer (RDL) design, comprising: first conductive segments comprising a repairable RDL design for the semiconductor device; a defect as part of the first conductive segments; and second conductive segments configured to repair the defect in the first conductive segments, wherein the second conductive segments provide rerouting around the defect of the first conductive segments.

In some embodiments, the first conductive segments comprise a length in a range of 80-90% of a total repairable RDL design length, with second conductive segments of the repairable RDL design including a length accounting for 10-20% of the total repairable RDL design length.

In some embodiments, the custom RDL design meets electrical constraints for the RDL when redundant traces of the first conductive segments are utilized.

Yet another aspect of the disclosure is a lot of devices with repairable redistribution layer (RDL) designs, comprising: an original repairable RDL formed within each of the semiconductor devices of the lot, wherein the original repairable RDL comprises first conductive segments; a first semiconductor device of the lot that comprises no manufacturing defects within the first conductive segments; a second semiconductor device of the lot that comprises at least one manufacturing defect within the first conductive segments; and second conductive segments of the repairable RDL design for the first semiconductor device that are different from the second conductive segments of the second semiconductor device, wherein the second conductive segments of the second semiconductor device are made according to a new custom RDL design to mitigate the negative effects of the at least one manufacturing defect within the first conductive segments.

In some embodiments, the at least one manufacturing defect in the first conductive segments of the second semiconductor device comprises an open or a short.

In certain embodiments, the second conductive segments of the second semiconductor device mitigates the negative effects of the at least one manufacturing defect by using a redundant metal trace.

In some embodiments, the second conductive segments of the second semiconductor device mitigates the negative effects of the at least one manufacturing defect by forming a pathway for conductive signals on a portion of the second conductive segments rather than on a portion of the first conductive segments.

In some embodiments, the short prevents a connection and the short is repaired using redundant traces prebuilt into the RDL.

In certain embodiments, the defect is repaired using a redundant prebuilt trace to re-route around defect and the defective trace being left unconnected.

In some embodiments, the first conductive segments are formed at a first level and the second conductive segments are formed at a second level vertically offset from the first level.

In some embodiments, the first conductive segments and the second conductive segments are formed at a same level without vertical offset from the first level, the first conductive segments being laterally offset from the second conductive segments.

The foregoing and other aspects, features, applications, and advantages will be apparent to those of ordinary skill in the art from the specification, drawings, and the claims. Unless specifically noted, it is intended that the words and phrases in the specification and the claims be given their plain, ordinary, and accustomed meaning to those of ordinary skill in the applicable arts. The inventors are fully aware that he can be his own lexicographer if desired. The inventors expressly elect, as their own lexicographers, to use only the plain and ordinary meaning of terms in the specification and claims unless they clearly state otherwise and then further, expressly set forth the "special" definition of that term and explain how it differs from the plain and ordinary meaning. Absent such clear statements of intent to apply a "special" definition, it is the inventors' intent and desire that the simple, plain and ordinary meaning to the terms be applied to the interpretation of the specification and claims.

The inventors are also aware of the normal precepts of English grammar. Thus, if a noun, term, or phrase is intended to be further characterized, specified, or narrowed in some way, then such noun, term, or phrase will expressly include additional adjectives, descriptive terms, or other modifiers in accordance with the normal precepts of English grammar. Absent the use of such adjectives, descriptive terms, or modifiers, it is the intent that such nouns, terms, or phrases be given their plain, and ordinary English meaning to those skilled in the applicable arts as set forth above.

Further, the inventors are fully informed of the standards and application of the special provisions of 35 U.S.C. § 112(f). Thus, the use of the words "function," "means" or "step" in the Detailed Description or Description of the Drawings or claims is not intended to somehow indicate a desire to invoke the special provisions of 35 U.S.C. § 112(f), to define the invention. To the contrary, if the provisions of 35 U.S.C. § 112(f) are sought to be invoked to define the inventions, the claims will specifically and expressly state the exact phrases "means for" or "step for", and will also recite the word "function" (i.e., will state "means for performing the function of [insert function]"), without also reciting in such phrases any structure, material or act in support of the function. Thus, even when the claims recite a "means for performing the function of . . . " or "step for performing the function of . . . ," if the claims also recite any structure, material or acts in support of that means or step, or that perform the recited function, then it is the clear intention of the inventors not to invoke the provisions of 35 U.S.C. § 112(f). Moreover, even if the provisions of 35 U.S.C. § 112(f) are invoked to define the claimed aspects, it is intended that these aspects not be limited only to the specific structure, material or acts that are described in the preferred embodiments, but in addition, include any and all structures, materials or acts that perform the claimed function as described in alternative embodiments or forms of the disclosure, or that are well known present or later-developed, equivalent structures, material or acts for performing the claimed function.

The foregoing and other aspects, features, and advantages will be apparent to those of ordinary skill in the art from the specification, drawings, and the claims.

BRIEF DESCRIPTION OF THE DRAWINGS

FIG. 1F illustrates a plan view of traces formed over a die or embedded device, similar to the semiconductor die shown in the cross-sectional side view of either the right side or left side of FIG. 1E.

DETAILED DESCRIPTION

The present disclosure includes one or more aspects or embodiments in the following description with reference to the figures, in which like numerals represent the same or similar elements. Those skilled in the art will appreciate that the description is intended to cover alternatives, modifications, and equivalents as may be included within the spirit and scope of the disclosure as defined by the appended claims and their equivalents as supported by the following disclosure and drawings. In the description, numerous specific details are set forth, such as specific configurations, compositions, and processes, etc., in order to provide a thorough understanding of the disclosure. In other instances, well-known processes and manufacturing techniques have not been described in particular detail in order to not unnecessarily obscure the disclosure. Furthermore, the various embodiments shown in the FIGS. are illustrative representations and are not necessarily drawn to scale.

This disclosure, its aspects and implementations, are not limited to the specific equipment, material types, or other system component examples, or methods disclosed herein. Many additional components, manufacturing and assembly procedures known in the art consistent with manufacture and packaging are contemplated for use with particular implementations from this disclosure. Accordingly, for example, although particular implementations are disclosed, such implementations and implementing components may comprise any components, models, types, materials, versions, quantities, and/or the like as is known in the art for such systems and implementing components, consistent with the intended operation.

The word "exemplary," "example," or various forms thereof are used herein to mean serving as an example, instance, or illustration. Any aspect or design described herein as "exemplary" or as an "example" is not necessarily to be construed as preferred or advantageous over other aspects or designs. Furthermore, examples are provided solely for purposes of clarity and understanding and are not meant to limit or restrict the disclosed subject matter or relevant portions of this disclosure in any manner. It is to be appreciated that a myriad of additional or alternate examples of varying scope could have been presented, but have been omitted for purposes of brevity.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, such as by a stripping process, leaving behind a patterned layer. Alternatively, some types of materials are patterned by directly depositing the material into the areas or voids formed by a previous deposition/etch process using techniques such as electroless and electrolytic plating.

Patterning is the basic operation by which portions of the photoresist material are partially removed, so as to provide a pattern or electroplating template for the subsequent formation of structures, such as patterning redistribution layers (RDLs), under bump mentalization (UBM), copper posts, vertical interconnects, or other desirable structures. Portions of the semiconductor wafer can be removed using photolithography, photomasking, masking, oxide or metal removal, photography and stenciling, and microlithography. Photolithography includes forming a pattern through laser direct imaging (also known as direct write or mask-less digital lithography) or in reticles of a photomask and transferring the pattern into the surface layers of the semiconductor wafer. Photolithography forms the horizontal dimensions of active and passive components on the surface of the semiconductor wafer in a two-step process. First, the pattern on the reticle, masks or direct write imaging design file are transferred into a layer of photoresist. Photoresist is a light-sensitive material that undergoes changes in structure and properties when exposed to light. The process of changing the structure and properties of the photoresist occurs as either negative-acting photoresist or positive-acting photoresist. Second, the photoresist layer is transferred into the wafer surface. The transfer occurs when etching removes or electroplating adds the portion of the top layers of semiconductor wafer not covered by the photoresist. The chemistry of photoresists is such that the photoresist remains substantially intact and resists removal by chemical etching solutions while the portion of the top layers of the semiconductor wafer not covered by the photoresist is removed by etching or a layer is added by electroplating. The process of forming, exposing, and removing the photoresist, as well as the process of removing or adding a portion of the semiconductor wafer can be modified according to the particular resist used and the desired results. Negative or positive tones resist can be designed for solvent or base develop solutions.

In negative-acting photoresists, photoresist is exposed to light and is changed from a soluble condition to an insoluble condition in a process known as polymerization. In polymerization, unpolymerized material is exposed to a light or energy source and polymers form a cross-linked material that is etch-resistant. In most negative resists, the polymers are polyisopremes. Removing the soluble portions (i.e., the portions not exposed to light) with chemical solvents or base developers leaves a hole in the resist layer that corresponds to the opaque pattern on the reticle. A mask whose pattern exists in the opaque regions is called a clear-field mask.

In positive-acting photoresists, photoresist is exposed to light and is changed from relatively nonsoluble condition to much more soluble condition in a process known as photosolubilization. In photosolubilization, the relatively insoluble resist is exposed to the proper light energy and is converted to a more soluble state. The photosolubilized part of the resist can be removed by a solvent or a base in the development process. The basic positive photoresist polymer is the phenol-formaldehyde polymer, also called the phenol-formaldehyde novolak resin. Removing the soluble portions (i.e., the portions exposed to light) with chemical solvents or base developers leaves a hole in the resist layer that corresponds to the transparent pattern on the reticle. A mask whose pattern exists in the transparent regions is called a dark-field mask.

After removal of the top portion of the semiconductor wafer not covered by the photoresist, the remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface can be beneficial or required to produce smaller and more densely packed active and passive components. Planarization can be used to remove material from the surface of the wafer and produce a uniformly flat surface. Planarization involves removing part of the top surface of the wafer with a grinding wheel or polishing pad. An abrasive material and corrosive chemical can be added to the surface of the wafer during planarization. Alternatively, mechanical abrasion without the use of corrosive chemicals is used for planarization. In some embodiments, purely mechanical abrasion is achieved by using a belt grinding machine, a standard wafer backgrinder, or other similar machine. The combined mechanical action of the abrasive and corrosive action of the chemical removes any irregular topography, resulting in a uniformly flat surface.

Back-end manufacturing refers to cutting or singulating the finished wafer into the individual semiconductor die and then packaging the semiconductor die for structural support and environmental isolation. To singulate the semiconductor die, the wafer can be cut along non-functional regions of the wafer called saw streets or scribes. The wafer is singulated using a laser cutting tool, laser silicon lattice disruption process, dry etch plasma dicing process, or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, redistribution layers, or wirebonds. An encapsulant or other molding material is deposited over the package to provide physical support and electrical isolation. The finished package is then inserted into an electrical system and the functionality of the semiconductor device is made available to the other system components.

Back-end manufacturing as disclosed herein also does more than merely packaging an embedded device or the semiconductor die for structural support and environmental isolation. The packaging described herein further provides non-monolithic electrical interconnection of die for increased functionality & performance. Previously, nearly all advanced semiconductor die were monolithic systems on chips (SoCs) where all electrical interconnect occurred on the silicon wafer during front-end processing. Now, however, work that was traditionally the domain of front-end domain work may be handled or moved to the back-end manufacturing, allowing many semiconductor die (chiplets) to be connected with packaging technology to form a chiplet-based SoC (which is non monolithic) and provides a composite package with greater functionality. The chiplet approach may also decrease waste from defects, increase production efficiency, reliability, and performance. The chiplet approach also allows for heterogeneous integration, where devices built by different front-end processes can be integrated into a composite package.

The electrical system can be a stand-alone system that uses the semiconductor device to perform one or more electrical functions. Alternatively, the electrical system can be a subcomponent of a larger system. For example, the electrical system can be part of a cellular phone, personal digital assistant (PDA), digital video camera (DVC), or other electronic communication device. Alternatively, the electrical system can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction can be beneficial or essential for the products to be accepted by the market. The distance between semiconductor devices must be decreased to achieve higher density.

FIGS. 1A-1E illustrate the placement and arrangement of embedded devices within an encapsulant or mold compound. The embedded devices may be semiconductor die singulated from a native semiconductor wafer. The embedded devices may be placed on a temporary carrier or substrate with an encapsulant or mold compound disposed therearound.

An embedded device comprises an active device, a semiconductor die comprising an active surface formed at the first surface, a semiconductor chip or chip, a bridge chip containing only routing layers without an active device, an integrated passive device (IPD), and a passive device. When the description refers to any of the above cited exemplary embedded devices, it is to be understood that any of the other embedded devices may also be used. As such, the references to "first die" and "second die" in FIG. 1G include any embedded device, as defined above.

Figure 1A:
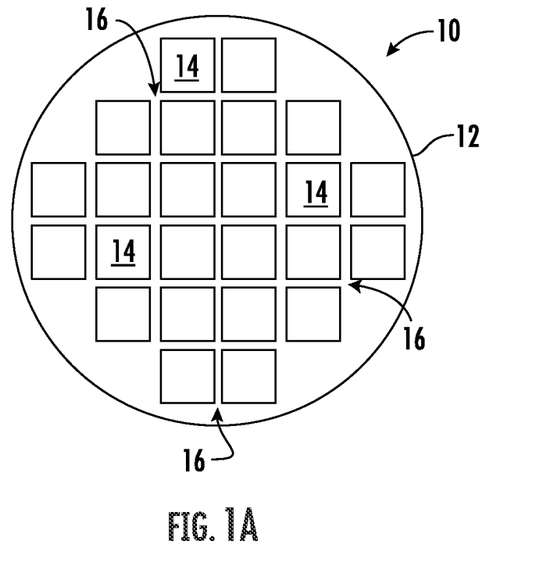
FIG. 1A illustrates a semiconductor wafer or semiconductor substrate with a base substrate material.

FIG. 1A illustrates a semiconductor wafer or semiconductor substrate 10 with a base substrate material 12, such as, without limitation, silicon, glass, ceramic, germanium, gallium arsenide, indium phosphide, silicon carbide, or other materials, for structural support. A plurality of semiconductor die or components 14 is formed on wafer 10 separated by a non-active, inter-die wafer area or saw street 16 as described above. Saw streets 16 provide cutting areas to singulate semiconductor wafer 10 into individual semiconductor die 14.

Figure 1B:
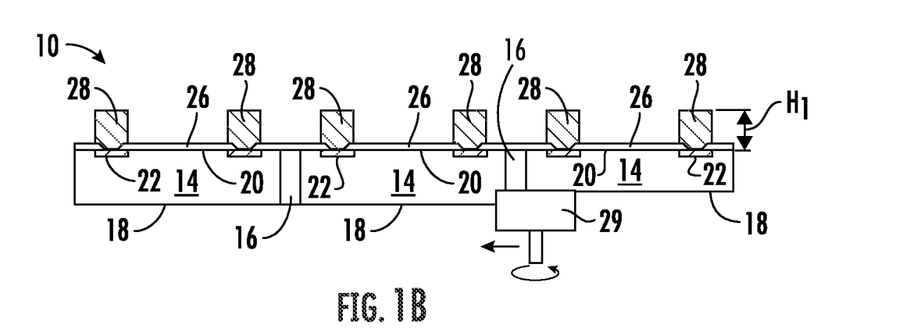
FIG. 1B illustrates a cross-sectional view of a portion of the semiconductor wafer.

FIG. 1B illustrates a cross-sectional view of a portion of semiconductor wafer 10. Each semiconductor die 14 has a backside or back surface 18 and an active surface 20 opposite the backside. Active surface 20 contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 20 to implement analog circuits or digital circuits, such as DSP, ASIC, memory, or other signal processing circuit. Semiconductor die 14 may also contain IPDs such as inductors, capacitors, and resistors, for RF signal processing.

An electrically conductive layer or contact pads 22 is formed over active surface 20 using PVD, CVD, electrolytic plating, electroless plating process, or other suitable metal deposition process. Conductive layer 22 can be one or more layers of aluminum (Al), copper (Cu), tin (Sn), nickel (Ni), gold (Au), palladium (Pd), silver (Ag), or other suitable electrically conductive material. Conductive layer 22 operates as contact pads or bond pads electrically coupled or connected to the circuits on active surface 20. Conductive layer 22 can be formed as contact pads disposed side-by-side a first distance from the edge of semiconductor die 14, as shown in FIG. 1B. Alternatively, conductive layer 22 can be formed as contact pads that are offset in multiple rows such that a first row of contact pads is disposed a first distance from the edge of the die, and a second row of contact pads alternating with the first row is disposed a second distance from the edge of the die.

FIG. 1B also illustrates the semiconductor substrate 10 and semiconductor die 14 can undergo an optional grinding operation with grinder 29 to planarize the backside 18 and reduce a thickness of the semiconductor substrate 10 and semiconductor die 14.

Figure 1C:
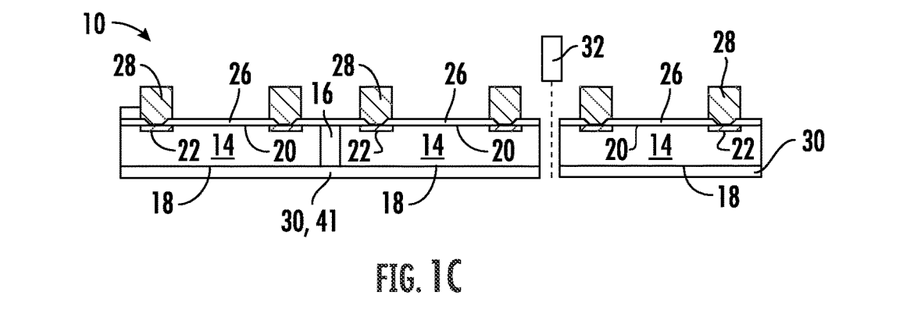
FIG. 1C shows singulation of the semiconductor wafer.

FIG. 1C shows an optional insulating or passivation layer 26 conformally applied over active surface 20 and over conductive layer 22. Insulating layer 26 can include one or more layers that are applied using PVD, CVD, screen printing, spin coating, lamination, molding, spray coating, sintering, thermal oxidation, or other suitable process. Insulating layer 26 can contain, without limitation, one or more layers of silicon dioxide (SiO2), silicon nitride (Si3N4), silicon oxynitride (SiON), tantalum pentoxide (Ta2O5), aluminum oxide (Al2O3), polymer, polyimide, benzocyclobutene (BCB), polybenzoxazoles (PBO), electronic molding compound (EMC) or other material having similar insulating and structural properties. Alternatively, semiconductor die 14 are packaged without the use of any PBO layers, and insulating layer 26 can be formed of a different material or omitted entirely. In another embodiment, insulating layer 26 includes a passivation layer formed over active surface 20 without being disposed over conductive layer 22. When insulating layer 26 is present and formed over conductive layer 22, openings are formed completely through insulating layer 26 to expose at least a portion of conductive layer 22 for subsequent mechanical and electrical interconnection. Alternatively, when insulating layer 26 is omitted, conductive layer 22 is exposed for subsequent electrical interconnection without the formation of openings.

FIG. 1C shows electrical interconnect structures 28 can be formed as copper columns, copper pillars, or copper posts and are disposed over, and coupled or connected to, contact pads 22. The interconnect structures 28 can be formed directly on contact pads 22 using patterning and metal deposition processes such as printing, PVD, CVD, sputtering, electrolytic plating, electroless plating, metal evaporation, metal sputtering, or other suitable metal deposition process. Interconnect structures 28 can be one or more layers of Al, Cu, Sn, Ni, Au, Ag, palladium (Pd), or other suitable electrically conductive material and can include one or more UBM layers. In an embodiment, a photoresist layer can be deposited over semiconductor die 14 and contact pads 22. A portion of the photoresist layer can be exposed and removed by an etching development process. Electrical interconnect structures 28 can then be formed as copper pillars in the removed portion of the photoresist and over contact pads 22 using a selective plating process. The photoresist layer can be removed leaving interconnect structures 28 that provide for subsequent mechanical and electrical interconnection and a standoff with respect to active surface 20 and insulating layer 26, if present. Preferably, interconnect structures 28 include a height in a range of 10-100 micrometers (μm), 5-50 μm, or about 25 μm.

FIG. 1C further shows wafer 10 can also be singulated into individual semiconductor die 14 through saw streets 16 using a saw blade or laser cutting tool 32 either before or after subsequent processing to the semiconductor die 10 and to the semiconductor die 14.

FIG. 1C also illustrates an optional die attach film or material (DAF) 30 may be attached to the back surface 18 of the semiconductor die 14, such as for subsequent mounting on a carrier. FIG. 1C also illustrates wafer 10 can also be singulated with a saw or wafer cutting tool 32 into individual semiconductor die 14 through saw streets 16 using a saw blade or laser cutting tool either before or after subsequent processing to the semiconductor die 10 and to the semiconductor die 14.

Figure 1D:
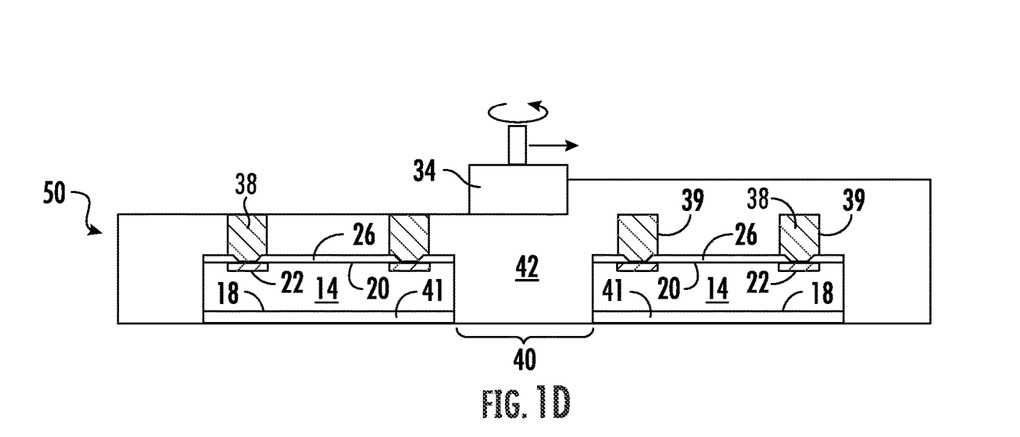
FIG. 1D illustrates embedded device or semiconductor die disposed within, and forming part of, a panel or embedded die panel.

FIG. 1D illustrates embedded device or semiconductor die 14 disposed within, and forming part of, a package, embedded die panel, or semiconductor device 50. An adhesive 41 can optionally be disposed on a backside 18 of semiconductor die 14. The adhesive 41 can be thermal epoxy, epoxy resin, B-stage epoxy film, ultraviolet (UV) B-stage film with optional acrylic polymer, or other suitable material. In an embodiment, the adhesive 41 can be disposed over backside 18 before semiconductor die 14 are mounted over, or to, a temporary carrier that can be used in the formation of embedded die panel 50.

The semiconductor die 14 can be separated by a space or gap 40 within the panel 50, the space 40 providing an area for a subsequently formed fan-out interconnect structure. A size of gap 40 includes sufficient area for optionally mounting semiconductor devices or components to be included within a final semiconductor device or package, such as a FOWLP. The space 40 can be maintained and filled between the semiconductor die 14 with an encapsulant 42 that can be deposited using a paste printing, compression molding, transfer molding, liquid encapsulant molding, lamination, vacuum lamination, spin coating, or other suitable applicator. The encapsulant 42 can be a polymer composite material, such as electronic molding compound, epoxy resin with filler, epoxy acrylate with filler, or polymer with proper filler. The encapsulant 42 can be formed as a single material that is disposed over and around semiconductor die 14 and electric interconnect structures 38. The encapsulant 42 can be in contact with sidewalls 39 of the electric interconnect structures 38 and also be disposed between the interconnect structures 38.

The panel 50 can optionally undergo a curing process to cure the encapsulant 42. The panel 50 can include a footprint or form factor of any shape and size. In some instances, the panel 50 can include a form factor similar to the form factor of the substrate 10, such as a 300 millimeter (mm) semiconductor wafer and includes a circular footprint having a diameter of 300 mm. The panel 50, like substrate 10, can be of any desirable size or shape such as circular, square, such as 600 mm×600 mm, or rectangular, that can be formed of any desirable size.

FIG. 1D also shows the panel 50 can undergo an optional grinding operation with grinder 34 to planarize the surface and reduce a thickness of the panel. A chemical etch can also be used to remove any potential metallic contamination on the encapsulant and create a slight recess in interconnect 38 with respect to the planarized encapsulant 42 in the panel 50. Thus, a surface of interconnect structures 38 can be exposed with respect to encapsulant 42 at an outer surface or periphery of the panel 50 to provide for electrical connection between the semiconductor die 14 and a subsequently formed interconnect structure, such as a fan-out interconnect structure.

Figure 1E:
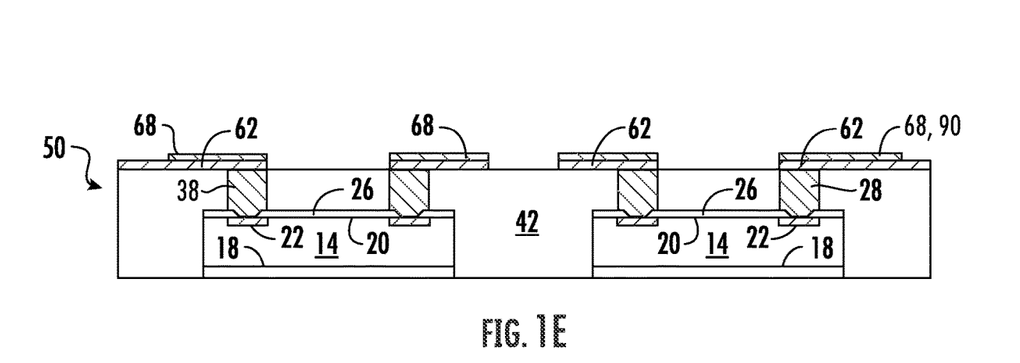
FIG. 1E shows a cross-sectional view of a portion of panel in which conductive layer is patterned and deposited over encapsulant, interconnects, and seed layer, to form RDLs as part of an interconnect structure.

FIG. 1E shows a cross-sectional view of a portion of panel 50 in which conductive layer 68 is patterned and deposited over encapsulant 42, interconnects 38, and seed layer 62, to form RDLs as part of an interconnect structure. The conductive layer 68 can be one or more layers of Al, Cu, Sn, Ni, Au, Ag, or other suitable electrically conductive material. The depositing or formation of conductive layer 68 can use wafer-like processing that uses the seed layer 28 as part of an additive process on a molded panel, such as PVD, CVD, electrolytic plating, electroless plating, or other suitable process. In an embodiment, conductive layer 68 is formed over seed layer 62 by a plating process that uses conductive layer 62 as a plating surface. The conductive layer 68 can provide electrical interconnection between electrical interconnect structures 38 and subsequently formed bumps or package interconnect structures that provide for the transmission of electrical signals between the semiconductor die 14 with other semiconductor die, other components and points external to a final semiconductor package. In other words, the conductive layer 68 can form part of a repairable RDL or repairable RDL traces (hereinafter, "repairable RDL").

FIG. 1F is a plan view of high-density traces 100 formed as part of a repairable RDL 92, that may be formed as part of package 50 or substrate 70. The repairable RDL may be formed over or under a die or embedded device 14, which include the semiconductor die 14 shown in the cross-sectional side view of either the right side or left side of FIG. 1E, as well as the semiconductor die shown in FIG. 1H, FIG. 1I, and FIG. 1J. The traces 100 may extend from a first end 102 to a second end 104 of the RDL 90. The first end 102 can be coupled to, or may comprise, a pad, contact pad, via pad, landing pad, or UBM pad 120, and the second end 104 can comprise another pad 120. The pads 120 may also be coupled to one or more vias, posts, columns, pillars, or vertical conductive interconnects 74, 74a, 220, 230. FIG. 1F also illustrates a ground plane or other conductive structure 130 that may be formed as part of a conductive layer 68, and that may also be formed with, or be part of (adjacent or offset from) the repairable RDL 90.

Figure 1G:
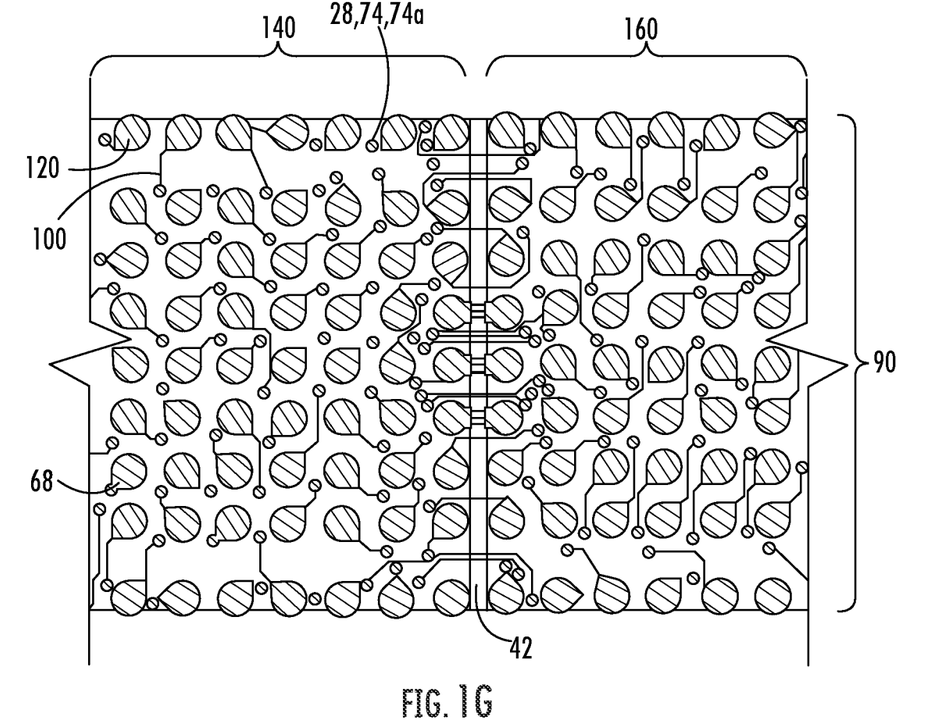
FIG. 1G is a plan view of traces formed over multiple die or embedded devices included within a single package, such that traces connect portions of the die (or embedded device) shown on the left side of FIG. 1G with the die (or embedded device) shown on the right side of FIG. 1G.

FIG. 1G is a plan view of traces 100 formed over, or as part of, a package 50 comprising multiple die or embedded devices 140, 160 included within a single package 50, such that traces 100 connect portions of the die (or embedded device) 140 shown on the left side of FIG. 1G with the die (or embedded device) 160 shown on the right side of FIG. 1G, which may benefit from use of custom, variable, or Adaptive™ RLs 90.

Figure 1H:
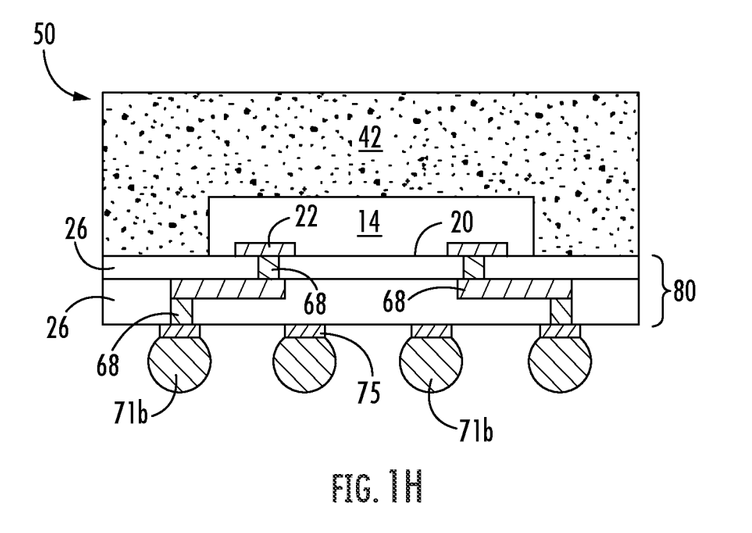
FIG. 1H illustrates a cross-sectional profile view of a chips first semiconductor device that may comprise repairable RDLs.

FIG. 1H illustrates a cross-sectional profile view of a semiconductor device 50 or chips first package 50a that may comprise repairable RDLs 92. The chips first package 50a may be formed by first providing the semiconductor die 14, and then encapsulating the semiconductor die 14 with encapsulant or mold compound 42. Next, the build-up interconnect structure 80 may be formed last over the semiconductor die 14 and the encapsulant 42. The build-up interconnect structure 80 may comprise conductive layers 68 and insulating or passivation layers 26, which may be alternately applied one over another. The conductive layers 68 may comprise RDLs 92, comprising both traces 100 and pads 120. Build-up interconnect structure 80 may comprise vias 74 in the case of conventional build-up structures and vertical conductive interconnects 74a in the case of molded substrate 70a, that may be coupled with the RDL 90 or traces 100. The RDLs 90 or traces 100, of one or more conductive layers 68 may be repairable as described in further detail with respect to FIGS. 2A-2D and FIGS. 3A and 3B. The chips first package 50a may further comprise under bump metallization (UBM) pads 75 and bottom side bumps, solder balls, or conductive package interconnects 71b.

Figure 1I:
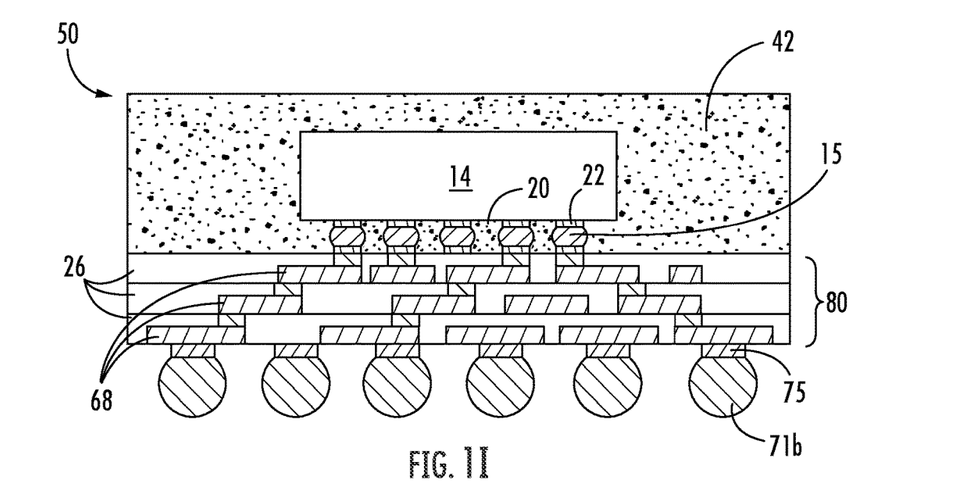
FIG. 1I illustrates a cross-sectional profile view of a chips last package that may comprise repairable RDLs.

FIG. 1I illustrates a cross-sectional profile view of a semiconductor device 50 or chips last package 50b that may comprise repairable RDLs 92. The chips last package 50b may be formed by first forming the build-up interconnect structure 80, such as over a temporary carrier or substrate. After the build-up interconnect structure 80 is formed, the semiconductor die 14 may flip chip mounted to the build-up interconnect structure 80 with flip chip interconnects or solder bumps 15. The semiconductor die 14, the flip chip bumps 15, and an exposed surface of the build-up interconnect structure 80 may then be encapsulated with encapsulant or mold compound 42. The build-up interconnect structure 80 may comprise conductive layers 68 and insulating or passivation layers 26, which may be alternately applied one over another. The conductive layers 68 may comprise RDLs 92, comprising both traces 100 and pads 120. Build-up interconnect structure 80 may comprise vias 74 in the case of conventional build-up structures and vertical conductive interconnects 74a in the case of molded substrate 70a, that may be coupled with the RDL 90 or traces 100. The RDLs 90 or traces 100, of one or more conductive layers 68 may be repairable as described in further detail with respect to FIGS. 2A-2D and FIGS. 3A and 3B. The Chips last package 50b may further comprise UBM pads 75 and bottom side bumps, solder balls, or conductive package interconnects 71b.

Figure 1J:
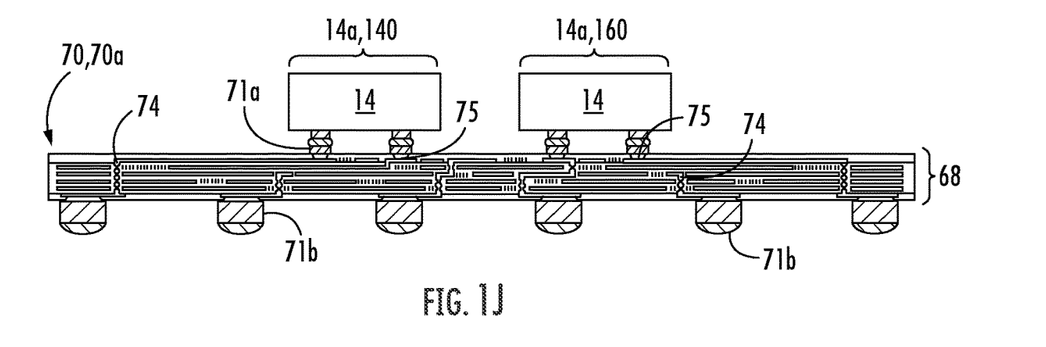
FIG. 1J illustrates a cross-sectional profile view of a substrate or interposer that may comprise repairable RDLs.

FIG. 1J illustrates a substrate or interposer 70 that may comprise a molded substrate 70a comprising top side pads 71a and bottom side bumps 71b for subsequent interconnects such as with other semiconductor devices, packages, semiconductor die 14, and substrates. FIG. 1H illustrates the molded substrate 70a with a flip-chip devices 14a. The molded substrates 70a may have been formed or built up over a temporary carrier that was subsequently removed. FIG. 1H also illustrates that the substrate 70 or molded substrate 70a may comprise vias 74 in the case of conventional build-up structures and vertical conductive interconnects 74a in the case of molded substrate 70a, that may be coupled with the RDL 90 or traces 100. The RDLs 90 or traces 100, of one or more conductive layers 68 of the substrate 70, 70a may be repairable as described in further detail with respect to FIGS. 2A-2D and FIGS. 3A and 3B. The substrate 70 or molded substrate 70a may further comprise UBM pads 75.

FIGS. 2A-2D illustrate schematic views of conductive layers 68 that may comprise one or more RDLs 90 comprising traces 100 and may comprise pads 120 that may be formed as part of a package 50, or a substrate or interposer 70. The pads 120 may comprise contact pads, via pads, landing pads, UBM pads, or any other suitable pad or structure larger than the trace 100. The conductive layers 68, including RDLs 90, may be formed comprising first conductive segments or a first metal layer 180 and second conductive segments or a second metal layer 200.

Figure 2A:
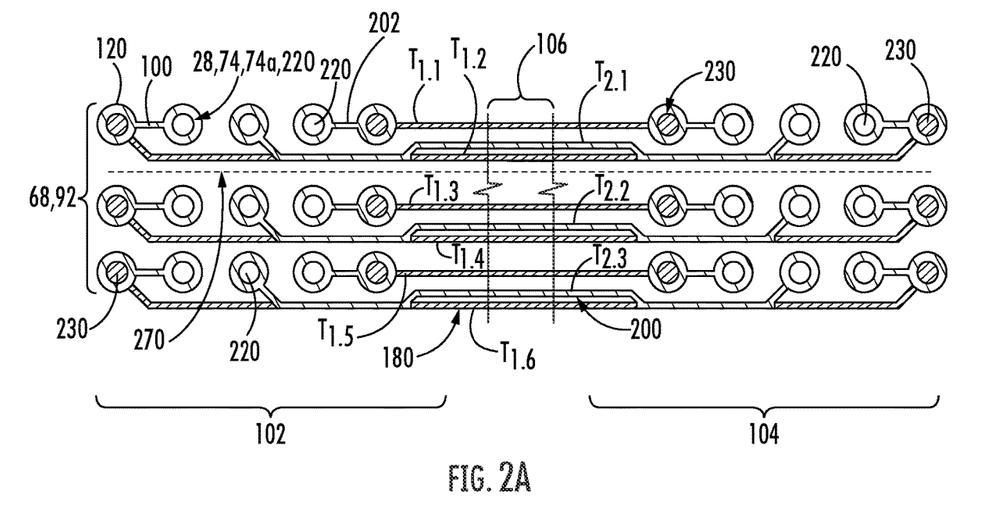
FIG. 2A also shows that the repairable RDLs differ from conventional traces in that the traces are not made (or continuously made) of a single, continuous, or electrically connected structure.

FIG. 2A illustrates a plan view of the first conductive segments 180 and the second conductive segments 200 being formed without any defects 260. The first conductive segments 180 and the second conductive segments 200 extend from a first end 102 to a second end 104, with a length or long segment of traces 106 extending between the first end 102 and the second end 104. The first end 102 (shown for example on the left side of FIG. 2A) can comprise one or more pads 120 formed from the first conductive layer 180. The pads 120 may be coupled to one or more vias, posts, columns, pillars, or vertical conductive interconnects 220, and one or more vias, posts, columns, pillars, or vertical conductive interconnects 230.

Figure 2B:
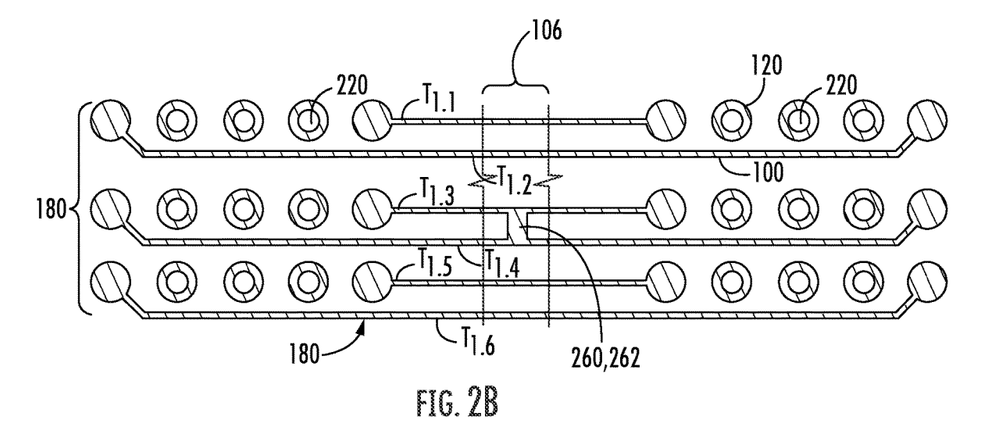
FIG. 2B shows the first layer and a shorting defect identified during an inspection of the first layer of traces, for which correction needs to be made.
Figure 2C:
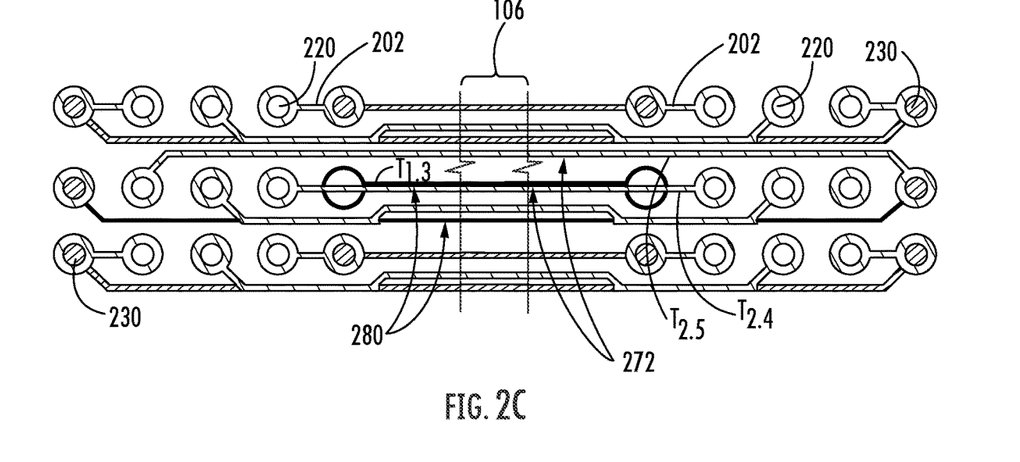
FIG. 2C illustrates a schematic view of traces or portions of the repairable traces or RDLs coupled, connected, or configured to be electrically continuous and carry an electrical current or signal once fully or continuously connected by the second (or one or more) subsequently added RDL trace segments, which avoid or modify the faulty first segments (with opens or shorts) and couple together the desired viable first segments.
Figure 2D:
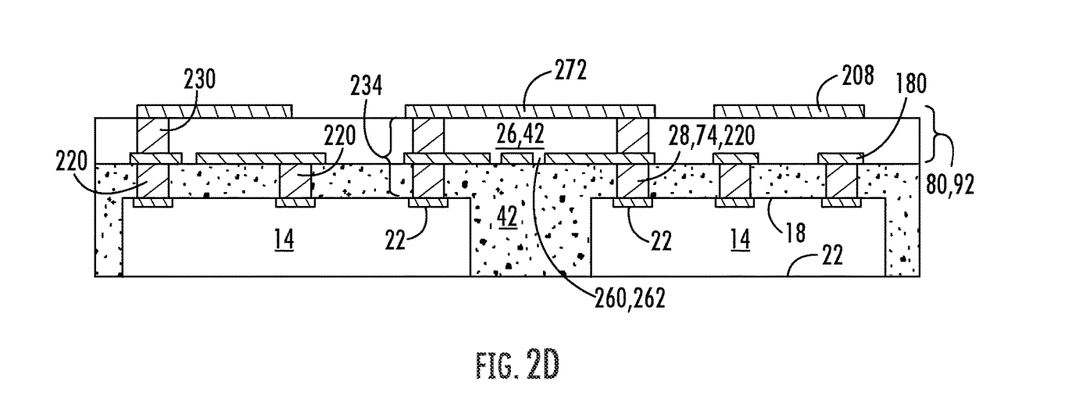
FIG. 2D illustrates a cross-sectional profile view of the repairable RDLs shown in plan view in FIGS. 2A-2C.

Conductive interconnects 220, 230, (or any other similar vertical conductive interconnects formed as part of a build-up interconnect structure 80 comprising any suitable number of layers) may be coupled to the one or more pads 120, including those formed as part of the first metal layer 180 and the second metal layer 200, as shown, e.g., in FIG. 2A and FIG. 2D. Conductive interconnects 220, 230 can be one or more layers of Al, Cu, Sn, Ni, Au, Ag, or other suitable electrically conductive material. The depositing or formation of conductive interconnects 220, 230 can include an additive process, such as PVD, CVD, electrolytic plating, electroless plating, or other suitable process.

The pads 120 on each end (both the first end 102 and second send 104), are shown as a non-limiting example as being arranged in an array or grid of 15 pads comprised of 3 rows and 5 columns. However, any suitable number or rows and columns may be used. Additionally, the first ends 102 and second ends 104 are for reference and convenience, and a Person of Ordinary Skill in the Art (POSA) will understand that relative position of the ends 102, 104, such as left and right, may be altered or vary.

FIG. 2A further shows, in plan view, that a number of pads 120 may be coupled with vertical conductive interconnects 220. FIG. 2A illustrates a non-limiting example in which nine central pads are shown as a 3×3 grid, which are included as part of the first end 102 and the second end 104. The vertical conductive interconnects 220 may be disposed below the first conductive segments 180, such as between embedded device 14 and conductive layer 180. FIG. 2D shows an example of a cross-sectional side view of the same, in which the first conductive segments 180 are coupled with vias 220, 230, or both, thereby being coupled to the contact pads 22 of the embedded device 14.

FIG. 2A illustrates that the first conductive segments 180 may comprise a number of traces, which are shown designated, e.g., as T1.1, T1.2, T1.3, T1.4, T1.5, and T1.6. FIG. 2A also shows that the repairable RDLs 90 differ from conventional traces in that the traces are not made (or continuously made) of a single, continuous, or electrically connected structure. Rather, the repairable RDLs 90 are made of the first conductive segments 180, including e.g., T1.1-T1.6, that are then subsequently connected, coupled, patterned, or made electrically common with the second conductive segments 200, including e.g., T2.1-T2.3. The second conductive segments 200 further comprise re-routed signals 272, and may be formed in one or more custom, variable, unique, or adaptive ways based on the first conductive segments 180, and defects 260 in the second conductive segments 200. See, e.g., FIGS. 2B and 2C.

Stated another way, FIG. 2A illustrates a repairable RDL 92 comprising multiple RDL trace segments 180, 200 that may be formed at more than one time, such as by forming the first conductive segments 180 at a first time and then subsequently forming the second conductive segments 200 at a second later time (after the first time). The second time may occur after an optical inspection 506 or test to determine which of the first segments 180 are viable to use (such as by detecting opens 264 and shorts 262 of the first segments 180), as shown for example, in FIG. 2B. In some instances, the first conductive segments 180 are formed at a first level and the second conductive segments 200 are formed at a second level vertically offset from the first level 180, an example of which is illustrated in the profile view of FIG. 2D. In other instances, the first conductive segments 180 and the second conductive segments 200 are formed at a same level without vertical offset from the first level, the first conductive segments 180 being laterally offset from the second conductive segments 200. In yet other instances, there may be both vertical and horizontal offset between the first conductive segments 180 and the second conductive segments 200.

A central portion of FIG. 2A shows a length or long segment of the trace 106 that has been omitted from the FIG. for convenience of maintaining relative scale but may extend between the first end 102 and second end 104. The centrally located trace length 106 may also comprise a break or separation therebetween. A reserved or redundant metal track or space 270 may be preserved for subsequently adding rerouted traces 284 for wiring around defects 260 and used in subsequent interconnection for desired signal routing as part of the repairable RDL 92.

FIG. 2B illustrates the first layer or the first conductive segments 180 from the repairable RDL 92 without the second conductive segments 200 being omitted (or before the formation of the second conductive segments 200). FIG. 2B further illustrates a short defect 262 formed as part of the first conductive segments 180 between trace T1.3 and T1.4 that may be identified during an inspection of the first conductive segments 180, for which correction needs to be made. Correction or accounting for the defect 260 may be made in a number of ways, including with new traces 100 or second conductive segments 200 that are separated vertically, horizontally, or both, from the first conductive segments 180. The new conductive segments 200 that correct for the defect 269 can be formed as reserved or redundant metal traces 272, can be formed as rerouted traces 284, and can be corrected by short connecting portions 202 of second conductive segments 200, as shown e.g., in FIG. 2C.

FIG. 2C provides an example in which short connecting portions 202 of second conductive segments 200 extend from ends of the first conductive segments 180, such as from T1.1, to a pad 120 comprising a via 220 coupled to the embedded device 14. By making the short connecting portion 202 short, a likelihood of a defect 260 being formed in short connecting portion 202 of the repairable RDL 92 is much lower than a likelihood of a defect occurring in the long segment 106 of the second conductive segments (assuming even distributions of errors for the length of the RDLs). A low likelihood for a defect 260 in the contact pad section is important because the repairable RDL 92 must connect with the contact pad 120 or via 220, and a defect close proximity to the via 220 cannot be avoided by routing around the defect either horizontally or vertically. Therefore, the contact pad segments or the short connecting portions 202 of the repairable RDL 92 may be kept short, such as less than or equal to 20-100 μm. Further, the first conductive segments 180 may themselves comprise spaces of gaps for subsequent interconnection or routing by later formed segments, such as second conductive segments 200. The first conductive segments 180 may comprise a length in a range of 80-90% of the total length of the trace 120 or RDL 90, with subsequent short connection portions 202 comprising a length accounting for 1-20%, 5-20%, or 10-20% of the overall length. The longer central sections 106 may be more prone to error, and also available to be repaired by the subsequently formed second conductive segments 200 (or other subsequently formed segments), such as is shown with the traces in FIG. 2C.

FIG. 2C illustrates a schematic plan view of traces 100 and pads 120 that form portions of the repairable RDLs 292 coupled, connected, or configured to be electrically continuous and carry an electrical current or signal once fully or continuously connected. Thus, FIG. 2C, continuing from FIG. 2B, shows the addition of the second conductive segments 200, after the formation of the first conductive segments 180, and the detection of a defect 260 in the first conductive segments 180. Alternatively, the second conductive segments 200 may also be formed after the formation and inspection of the first conductive segments 180, even if no defects 260 are formed, in which case the second conductive segments 200 may be formed according to an original design without custom, variable, or adaptive changes in the second conductive segments 200 to account for defects 260.

FIG. 2C also illustrates how the second conductive segments 200 (or one or more) subsequently added RDL trace segments, can be formed to customly, variably, or adaptively avoid, modify, or route around the defects 260 in the first conductive segments 180 (such as shorts 262 and opens 264) and couple together the desired viable first segments. More specifically, FIG. 2C shows two electrically unconnected defective traces 280, traces T1.3 and T1.4 of the first conductive segments 180 that remain electrically unconnected and whose function and electrically connection is replaced or superseded by electrical interconnection through two new re-routed signals 272, namely T2.4 and T2.5, respectively. The re-routed signals 272 are formed as part of the second conductive segments 200, which are vertically separated from, and are made on a different layer than, the first conductive segments 180, to accommodate rerouting, as part of the completed repairable or repaired RDL 92. See also FIG. 2D, which shows a cross-sectional side view of the repairable RDL 92. In either event, the repaired RDL 92 which includes the custom, variable, and adaptive formation of the re-routed signals 272, which are formed after, and account for, the testing or optical inspection. (AOI) of the first conductive segments 180.

FIG. 2C illustrates an example in which all (or 100%) of the 6 traces 100 (T1.1-T1.6) of the first conductive segments 180 are repairable. Each of traces T1.1-T1.6 is repairable since final connectivity to vias 220 is made with short connective portions 202. The short connective portions 202 of the traces 100 formed from second conductive segments 200 may be the initial and final segments of the traces 100 such as for any of traces T1.1-T1.6. The short connective portions 202 may be those that extend from, and are coupled with, the contact pads 120, or both the contact pads 120 and the vias 220, 230, that then extend a short distance therefrom.

However, a POSA will appreciate that not all of the traces 100 of a RDL 90 need to be repairable or part of a repairable RDL 92. In some instances, only a portion of an RDL 90, such as less than an entirety of the RDL 90 will be designed or formed as a repairable RDL 92. A determination of which portions of the RDL 90, or which traces 100 may be repairable, may be determined based on which traces 100 are likely to have defects. Those traces 100 with a sufficiently high likelihood of defects 260, such as passed on a length of the trace 100, or historical precedence, could be identified and only those traces 100 be formed as repairable traces, such as with space for a short connecting portion 202, or space for rerouted signals 272. For example, many RDLs 90 may have only a small area of very high-density traces with long parallel lengths where defects are more common, and only that high-density area may be formed as a repairable RDL 92. High density traces 100—when viewed in plan view—may be formed as being interleaved, nested, or interdigitated.

Figure 3A:
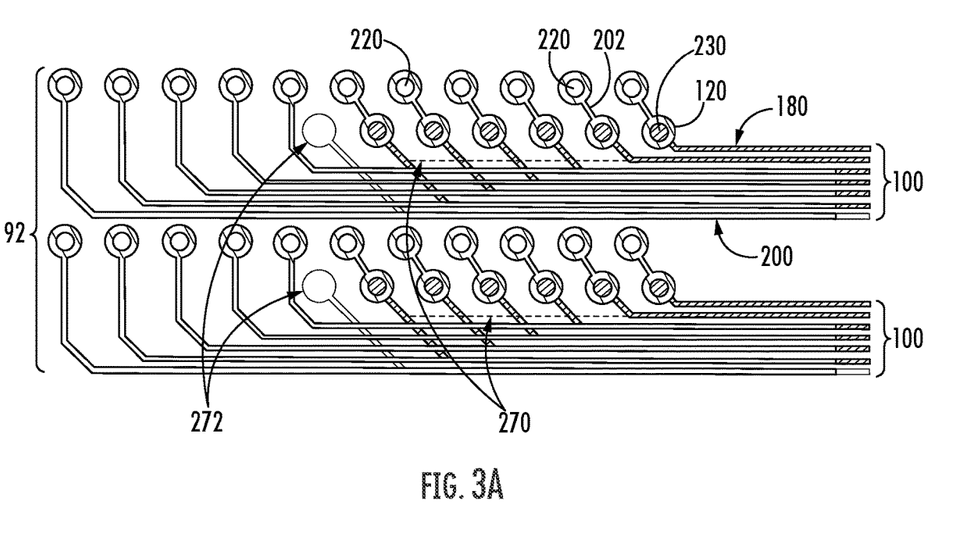
FIG. 3A presents a schematic view of traces or portions where the repairable RDL is made of the initial traces are subsequently connected, coupled, patterned, or made electrically common with the second segments.
Figure 3B:
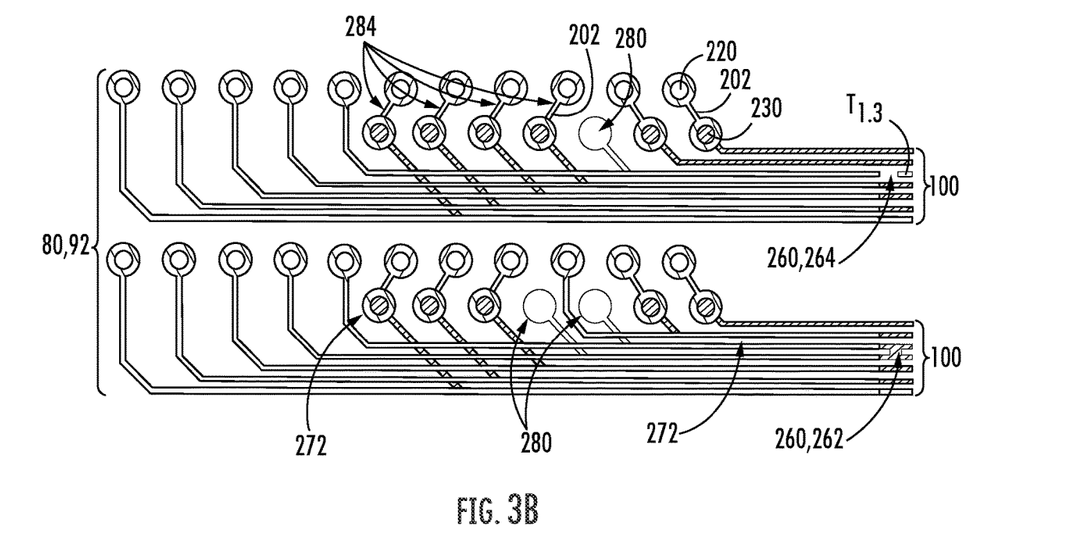
FIG. 3B, continuing from FIG. 3A, illustrates a schematic view of traces or portions showing both short and open defects in different configurations.

FIGS. 3A and 3B illustrate another schematic plan view of a repairable RDL 92 comprising traces 100, similar to FIGS. 2A-2C, comprising first conductive segments 180 and the second conductive segments 200. FIGS. 3A and 3B differ from FIGS. 2A-2C by focusing on a first or left side of the traces 100 and pads 120, with the right or second side of the traces 100 and pads 120 not shown.

FIG. 3A illustrates an instance of a repairable RDL 92, with no defect present. The repairable RDL 92 comprises first conductive segments 180 and second conductive segments 200 that are subsequently connected, coupled, patterned, or made electrically common with the first conductive segments 180. The second segments 200 are vertically separated and vertically offset from the first segments, such as by being formed on different layers of a build-up interconnect structure 80, such as within a semiconductor package, integrated circuit package, or module 50, or within a circuit board, interposer, molded substrate, or other suitable substrate or structure 70. Like with the examples described in FIGS. 2A-2D, an electrical route may be completed by having various first conductive segments 180 connected vertically through the package 50, substrate 70, build-up interconnect structure 80, or repairable RDL 92, such as through vias 220 and 230. FIG. 3A also shows redundant metal traces 272 and space for extra traces 270 as part of the second conductive segments 200 that may be used when needed because of defects 260, as shown in FIG. 3B.

FIG. 3B, similar from FIG. 3A, illustrates a schematic view of a repairable RDL 92 that accounts for defects 260 with traces 100, which include both short defects 262 and an open defects 264. As shown in the upper portion of traces 100 in FIG. 3B, when an open defect 264 is detected in the first conductive segments 180, the second conductive segments 200 do not make contact and are not configured to be electrically joined to the trace T1.3 with the open defect. Instead, an available redundant trace 272 is used to re-route around the defective trace 280 (T1.3 with defect 264), and the defective trace T1.3 is left unconnected.

As shown in the lower portion of FIG. 3B, when a short 262 is detected between two traces (T1.3 and T1.4), those two traces may be abandoned as unconnected defective traces 280, and the traces with the short in the first layer as part of the first conductive segments 180 may not be connected with the second conductive segments 200, such as through short connecting portions 202. Instead, redundant traces 272 may be used to reroute around the defect 260 and short connecting portions 202 may be formed as part of the second conductive segments 200 to reroute 284 around the defect 260.

In yet other instances, repairable RDLs 92 (whether including features described with respect to FIGS. 2A-2D, FIGS. 3A-3B, or both) may further comprise traces 100 are not made of a single, continuous, or electrically connected structure, but instead have spaces, separations, breaks, or gaps. After formation of the first conductive segments 180 with gaps, and after inspection or testing, or validation, the second conductive segments 200 may be formed to connect one or more of the first conductive segments 180 to complete an electrically conductive path, signal route, or other structure. The repairable RDL 92 can thereby be completed according to an original design or according to a modified design, based on any detected structural or manufacturing defects 260 (such as shorts 262 and opens 264) in the first conductive segments 180, or for other desired design performance or functionality.

Figure 4:
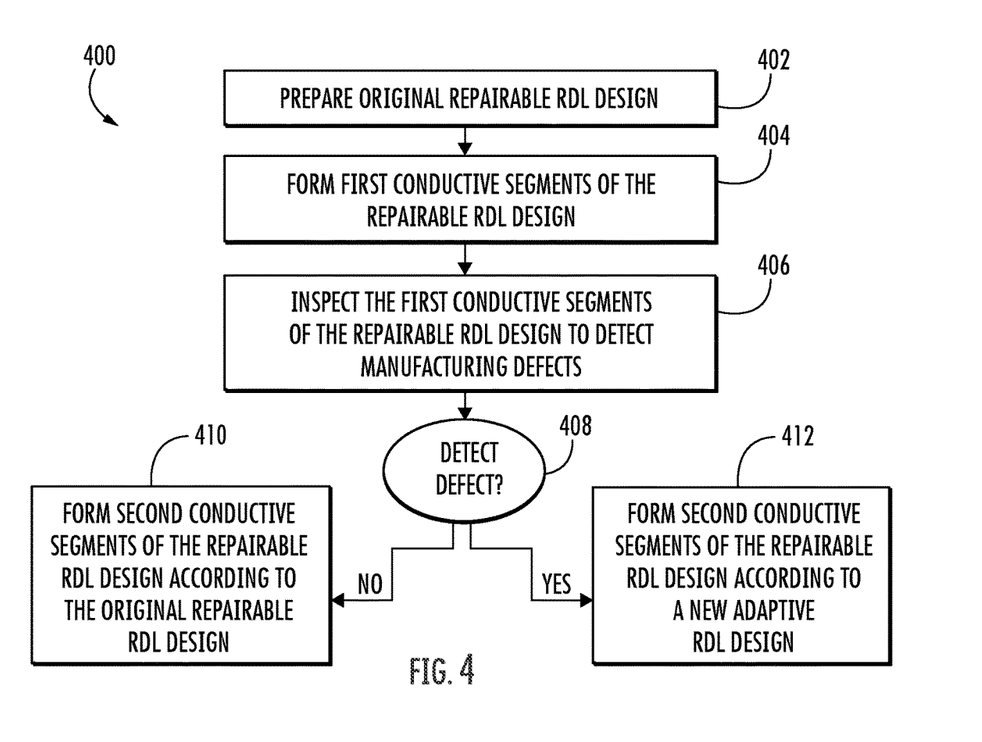
FIG. 4 illustrates a flow chart, schematic, or wire frame, for a method or process of creating repairable RDLs.
Figure 5:
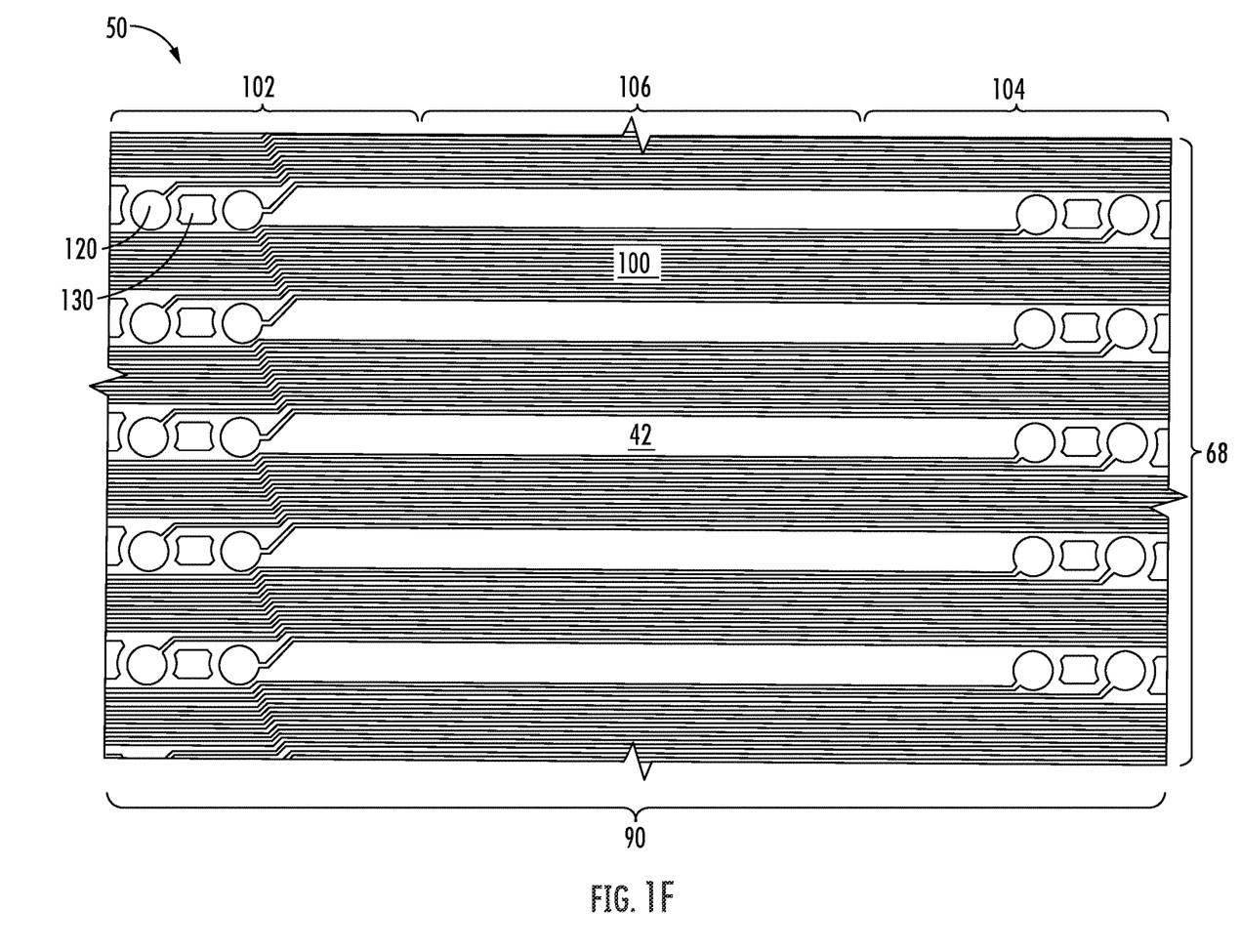

FIG. 4 illustrates a flow chart, schematic, or wire frame, for a method or process 400 of creating repairable RDL 92. As shown in FIG. 4, an original repairable RDL 92 may be prepared 402. First conductive segments 180 of the repairable RDL design 92 may be formed, 404. The first conductive segments 180 of the repairable RDL 92 may be inspected 406 to detect defects 260. If defects are not detected, then the repairable RDL 92 may be made according to an original design 410. If defects are detected, then the repairable RDL 92 (such as second conductive segments 200 may be made according to a new custom, unique, or adaptive design 412.

A new repaired RDL design 92 may be determined customly, uniquely, or adaptively, in real time during product manufacture, such as by inspecting a constructed element (first conductive segment 180) and making adjustments for subsequent signal routing, repairable RDLs, or structures. Changes to portions of the repairable RDL design 92, such as the second conductive segments 200, may be made by changing the location and position of subsequently formed second conductive segments 200. The repairable RDL 92 may be adaptively updated by modifying one or more features horizontally on a same layer, by modifying one or more features vertically on a different layer, or both. Thus, it will be understood by a POSA that for mediation of defects 260 in a vertical direction or across two or more vertically separated layers, 2 or more layers are needed. However, any number of layers may be used, including 3-12, or 3 or more layers. Furthermore, when a single layer of routing is insufficient for the function and design of a package, often more than one layer but less than an entire second layer of routing is needed, such as, e.g., 1.3 layers. In such instances, the extra 0.7 layer (which may be rounded to a full layer) may be used for redundant structures or repairable RDL components that may be included in an original design, formed as part of the package, and then optional used if needed for adaptive, on the fly, or spontaneous design changes resulted from defects during processing earlier features of the device or device package.

Given expected defect rates in manufacturing, such as in semiconductor device packaging, die placement error is often considered the first leading cause of defective packaging, while defects in routing, traces, or RDL defects are often considered the second leading cause of defective packaging. For example, within a single package comprising 9 embedded devices, there may be as many as 10,000 traces, a defect in any one of which may cause the entire part (at a cost of, e.g., $50 or more) to be defective. On the other hand, the use of repairable RDLs, as described herein, may allow for such errors, even 1 in 10,000 errors, to not be fatal for an entire package, and allow for adaptive RDL or trace routing to bypass, avoid, remedy, or otherwise mitigate the defective (open or short) RDL or trace defect.

When an original repairable RDL design is prepared, as shown as the first element 402 of FIG. 4, the original design may advantageously be designed to keep rerouting options open until the last or upper layer of the device/packaging. Moving from lower (or earlier formed) RDL layer moving up (or later) in successively built layers, RDL or trace segments may get shorter and shorter because there is less time (less space and fewer subsequent layers/patters, and fewer opportunities to correct defects). In the process of adaptively creating new adaptive RDL or trace routing, the new designs must meet electrical constraints in real time (or "on the fly") as the new routing and patterns are developed, and which may be accounted for the connecting of other segments or redundant traces, pads, vertical interconnects or RDL structures. By so doing, defects that would otherwise cause a packaged or partially packaged device to no longer be a good device or known good device (KGD) can be overcome. Defective or unusable devices that would otherwise be of little, reduced, or no value may be used by working around the defects with the repairable RDL design and adaptive RDLS segments or components.

While this disclosure includes a number of embodiments in different forms, there is presented in the drawings and written descriptions in the following pages detail of particular embodiments with the understanding that the present disclosure is to be considered as an exemplification of the principles of the disclosed methods and systems, and is not intended to limit the broad aspect of the disclosed concepts to the embodiments illustrated. Additionally, it should be understood by those of ordinary skill in the art that other structures, manufacturing devices, and examples could be intermixed or substituted with those provided. In places where the description above refers to particular embodiments, it should be readily apparent that a number of modifications may be made without departing from the spirit thereof and that these embodiments and implementations may be applied to other technologies as well. Accordingly, the disclosed subject matter is intended to embrace all such alterations, modifications and variations that fall within the spirit and scope of the disclosure and the knowledge of one of ordinary skill in the art.

What is claimed:
1. A method of forming a repairable redistribution layer (RDL) design, comprising:
preparing an original repairable RDL design;
forming first conductive segments of the repairable RDL design;

inspecting the first conductive segments of the repairable RDL design to detect manufacturing defects;

detecting at least one defect in the first conductive segments and leaving the at least one defect and the first conductive segments of the repairable RDL design physically unaltered and electrically unconnected after the defect is detected; and forming second conductive segments of the repairable RDL design according to a new custom RDL design to mitigate the negative electrical effects of the at least one defect among the first conductive segments.

2. The method of claim 1, wherein the at least one defect comprises a short between a portion of the first conductive segments.

3. The method of claim 2, wherein the short is repaired by forming at least one of the second conductive segments coupled to a redundant element previously formed as part of the original repairable RDL design to form a new route around the short.

4. The method of claim 2, wherein the defect is repaired using a redundant prebuilt trace to re-route around the defect and the defective trace being left unconnected.

5. The method of claim 1, wherein the at least one defect comprises an open between a portion of the first conductive segments.

6. The method of claim 1, wherein the first conductive segments are formed at a first level and the second conductive segments are formed at a second level vertically offset from the first level.

7. The method of claim 1, wherein the first conductive segments and the second conductive segments are formed at a same level without vertical offset from the first level, the first conductive segments being laterally offset from the second conductive segments.

8. The method of claim 1, wherein new custom RDL design is designed in real time during repairable RDL production and the new custom RDL design meets electrical constraints for the RDL while being designed in real time.

9. The method of claim 1, wherein the first conductive segments comprise a length in a range of 80-90% of a total repairable RDL design length, with second conductive segments of the repairable RDL design including a length accounting for 10-20% of the total repairable RDL design length.

10. A method of forming a repairable redistribution layer (RDL) design, comprising:
utilizing an original repairable RDL design;
forming first conductive segments of the repairable RDL design;
inspecting the first conductive segments of the repairable RDL design to detect manufacturing defects;
detecting at least one defect in the first conductive segments and leaving the at least one defect and the first conductive segments of the repairable RDL design physically unaltered and electrically unconnected after the defect is detected; and
forming second conductive segments of the repairable RDL design according to a new custom RDL design to mitigate the negative effects of the at least one defect among the first conductive segments.

11. The method of claim 10, wherein the defect comprises a short or open.

12. The method of claim 10, wherein the at least one defect comprises a short between a portion of the first conductive segments.

13. The method of claim 12, wherein the short is repaired by forming at least one of the second conductive segments coupled to a redundant element previously formed as part of the original repairable RDL design to form a new route around the short.

14. The method of claim 12, wherein the defect is repaired using a redundant prebuilt trace to re-route around the defect and the defective trace being left unconnected.

15. The method of claim 10, wherein the at least one defect comprises an open between a portion of the first conductive segments.

16. The method of claim 10, wherein the first conductive segments are formed at a first level and the second conductive segments are formed at a second level vertically offset from the first level.

17. The method of claim 10, wherein the first conductive segments and the second conductive segments are formed at a same level without vertical offset from the first level or the first conductive segments are laterally offset from the second conductive segments.

18. The method of claim 10, wherein the first conductive segments and the second conductive segments are both vertically and horizontally offset.

19. The method of claim 10, wherein new custom RDL design is designed in real time during repairable RDL production and the new custom RDL design meets electrical constraints for the RDL while being designed in real time.

20. The method of claim 10, wherein after the at least one defect is detected the at least one defect and the first conductive segments are electrically unconnected to an original circuit to which the first conductive segments would have otherwise been subsequently connected.

* * * * *